US007091513B1

(12) United States Patent
Derraa

(10) Patent No.: US 7,091,513 B1
(45) Date of Patent: Aug. 15, 2006

(54) CATHODE ASSEMBLIES

(75) Inventor: Ammar Derraa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 09/711,587

(22) Filed: Nov. 13, 2000

Related U.S. Application Data

(62) Division of application No. 09/251,262, filed on Feb. 16, 1999.

(51) Int. Cl.
*H01L 29/06* (2006.01)
*H01L 29/12* (2006.01)

(52) U.S. Cl. .......................................... 257/13; 257/10

(58) Field of Classification Search .................. 257/13; 445/50; 313/306

See application file for complete search history.

(56) References Cited

U.S. PATENT DOCUMENTS

| | | | | |
|---|---|---|---|---|
| 3,814,968 | A | | 6/1974 | Nathanson et al. |
| 4,957,881 | A | | 9/1990 | Crotti |
| 5,129,850 | A | | 7/1992 | Kane et al. |
| 5,141,460 | A | | 8/1992 | Jaskie et al. |
| 5,157,002 | A | | 10/1992 | Moon |
| 5,202,571 | A | * | 4/1993 | Hirabayashi et al. |
| 5,401,676 | A | * | 3/1995 | Lee ............................ 438/20 |
| 5,421,958 | A | | 6/1995 | Fathauer et al. |
| 5,427,648 | A | | 6/1995 | Pamulapati et al. |
| 5,430,300 | A | | 7/1995 | Yue et al. |
| 5,518,950 | A | | 5/1996 | Ibok et al. |
| 5,608,285 | A | | 3/1997 | Vickers et al. |
| 5,616,519 | A | | 4/1997 | Ping |
| 5,619,097 | A | * | 4/1997 | Jones ......................... 313/495 |
| 5,627,382 | A | | 5/1997 | Canham et al. |

(Continued)

OTHER PUBLICATIONS

Boswell, E. et al., "Characterization of Porous Silicon Field Emitter Properties", J.Vac.Sci. Technol. B 14(3), May/Jun. 1996, pp. 1895-1898.

(Continued)

*Primary Examiner*—Zandra V. Smith
*Assistant Examiner*—Kiesha Rose
(74) *Attorney, Agent, or Firm*—Wells St. John P.S.

(57) ABSTRACT

In one aspect, the invention encompasses a method of treating the end portions of an array of substantially upright silicon-comprising structures. A substrate having a plurality of substantially upright silicon-comprising structures extending thereover is provided. The substantially upright silicon-comprising structures have base portions, and have end portions above the base portions. A masking layer is formed over the substrate to cover the base portions of the substantially upright silicon-comprising structures while leaving the end portions exposed. The end portions are then exposed to conditions which alter the end portions relative to the base portions. In another aspect, the invention encompasses a method of treating the ends of an array of silicon-comprising emitter structures. A substrate having a plurality of silicon-comprising emitter structures thereover is provided. The emitter structures have base portions and ends above the base portions. A layer of spin-on-glass is formed over the substrate. The layer of spin-on-glass covers the base portions of the emitter structures and leaves the ends exposed. The ends are then exposed to conditions which alter the ends relative to the base portions. In yet another aspect, the invention encompasses a cathode assembly which includes a plurality of silicon-comprising emitter structures projecting over a substrate. The emitter structures have base portions and ends above the base portions, and the ends comprise a different material than the base portions.

7 Claims, 3 Drawing Sheets

U.S. PATENT DOCUMENTS

| | | | | |
|---|---|---|---|---|
| 5,665,657 | A | | 9/1997 | Lee |
| 5,666,020 | A | * | 9/1997 | Takemura .................. 313/306 |
| 5,705,028 | A | | 1/1998 | Matsumoto |
| 5,729,094 | A | * | 3/1998 | Geis et al. |
| 5,731,214 | A | | 3/1998 | Kurihara |
| 5,817,201 | A | | 10/1998 | Greschner et al. |
| 6,130,106 | A | * | 10/2000 | Zimlich |

OTHER PUBLICATIONS

Sugino, T. et al., "Electron Emission from Boron Nitride Coated Si Field Emitters", Appl. Phys. Lett. 71(18), Nov. 3, 1997, pp. 2704-2706.

Ko, Y. et al., "Electron Emission and Structure Properties of Cesiated Carbon Films Prepared by Negative Carbon Ion Beam", J.Appl. Phys. 82(5), Sep. 1, 1997, pp. 2631-2635.

Lee, J. et al., "Emission Characteristics of Silicon Field Emitter Arrays Fabricated by Spin-On-Glass Etch-back Process", 9$^{th}$ Internatl. Vacuum Microelectronics Conference, St. Petersburg 1996, pp. 380-383.

Takai, M. et al., "Enhanced Electron Emission from n-type Porous Si Field Emitter Arrays", Appl. Phys. Lett. 66(4), Jan. 23, 1995, pp. 422-423.

Lee, J. et al., "Fabrication and Characterization of Silicon Field Emitter Arrays by Spin-On-Glass Etch-back Process", J.Vac. Sci. Technol. B 16(1), Jan./Feb. 1998, pp. 238-241.

Matsuura, M. et al., "A Highly Reliable Self-Planarizing Low-k Intermetal Dielectric for Sub-quarter Micron Interconnects", IEEE 1997, pp. 31.6.1-31.6.4.

ARTICLE: McClatchie, S. et al., "Low Dielectric Constant Flowfill® Technology for IMD Applications", Electrotech Ltd., Bristol, U.K., undated, 7 pages, date unknown.

ARTICLE: Kiermasz, A. et al., Electrotech Ltd., U.K., "Planarisation for Sub-Micron Devices Utilising a New Chemistry", presented at DUMIC Conference, California, Feb. 1995, 2 pages.

ARTICLE: Beekmann, K. et al., Electrotech Ltd., U.K., "Sub-Micron Gap Fill and In-Situ Planarisation Using Flowfill™ Technology", presented at ULSI Conference, Portland, OR, Oct. 1995, pp. 1-7.

* cited by examiner

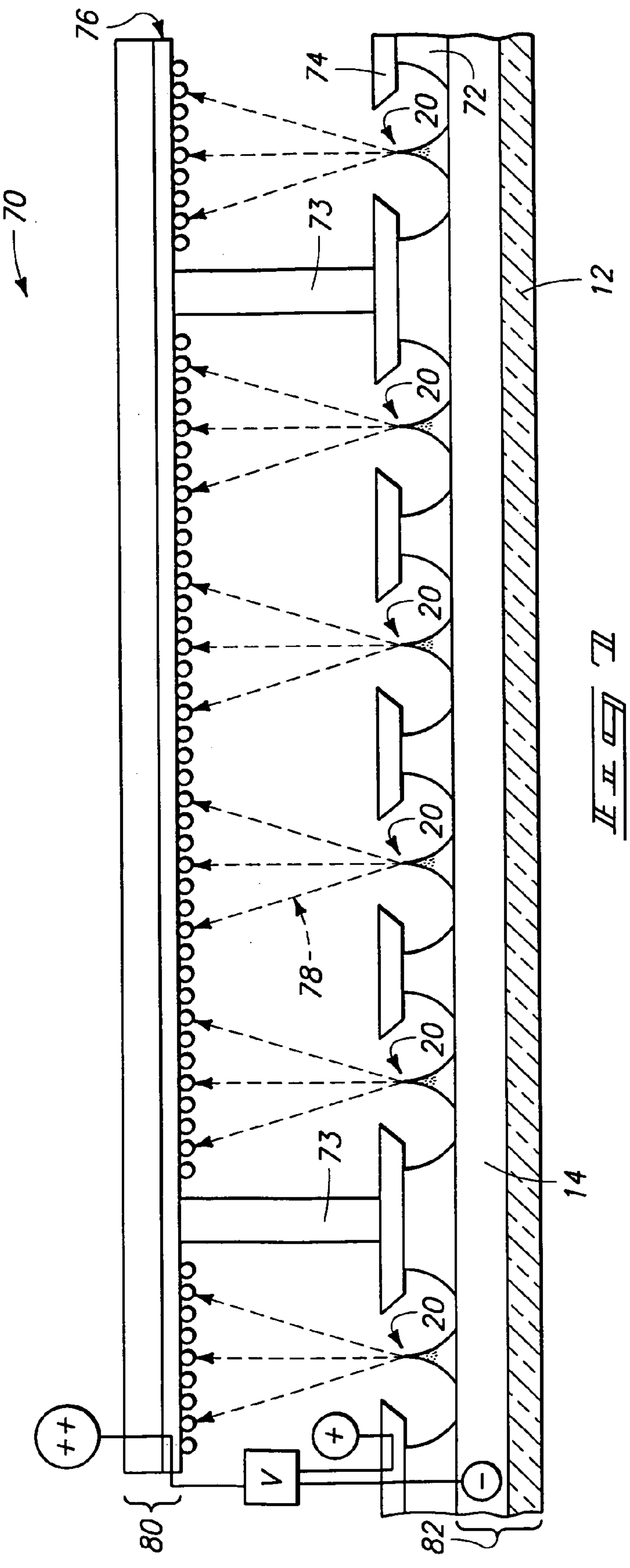
70
76
74
72
20
73
12
14
78
80
82
++
+
−
V

CATHODE ASSEMBLIES

This patent resulted from a divisional application of U.S. patent application Ser. No. 09/251,262, which was filed on Feb. 16, 1999.

PATENT RIGHTS STATEMENT

This invention was made with Government support under Contract No. DABT63-97-C-0001 awarded by Advanced Research Projects Agency (ARPA). The Government has certain rights in this invention.

TECHNICAL FIELD

The invention pertains to methods of treating substantially upright silicon-comprising structures, such as, for example, methods of treating silicon-comprising emitter structures. In particular aspects, the invention pertains to methods of forming field emission display devices. In other particular aspects, the invention pertains to cathode assemblies.

BACKGROUND OF THE INVENTION

Silicon-comprising field emitters are currently being designed and incorporated into field emission display devices, and show promise as candidates for electron sources in vacuum microelectronic devices. It is generally desirable to fabricate the emitters to have tips that are as sharp as possible, as such can improve control of electron emission from the tips. For instance, clarity, or resolution, of a field emission display is a function of, among other things, emitter tip sharpness. As sharper emitter tips can produce higher resolution displays than less sharp emitter tips, numerous methods have been proposed for fabrication of very sharp emitter tips (i.e., emitter tips having tip radii of 100 nanometers or less).

Fabrication of very sharp tips has, however, proved difficult. Accordingly, other methods, besides simply sharpening emitter tips, have been proposed for improving electron emission from emitters. Among such other methods are procedures for treating silicon-comprising emitters to convert the silicon to porous silicon, and procedures for treating silicon-comprising field emitters to coat the emitters with materials having lower work function properties than silicon. Such materials include, for example, diamond, cesium (such as, for example, cesiated carbon) and boronitride (the boronitride can be undoped, or doped with, for example, sulfur).

The above-discussed procedures of treating silicon-comprising emitters show promise for improving emission from individual emitters, as well as for improving uniformity of emission across arrays of emitters. Accordingly, it would be desirable to develop methods of fabricating emitters wherein emitter treatments are incorporated into the emitter fabrication processes.

SUMMARY OF THE INVENTION

In one aspect, the invention encompasses a method of treating the end portions of an array of substantially upright silicon-comprising structures. A substrate having a plurality of substantially upright silicon-comprising structures extending thereover is provided. The substantially upright silicon-comprising structures have base portions, and have end portions above the base portions. A masking layer is formed over the substrate to cover the base portions of the substantially upright silicon-comprising structures while leaving the end portions exposed. While the masking layer covers the base portions, the end portions are exposed to conditions which alter the end portions relative to the base portions.

In another aspect, the invention encompasses a method of treating the ends of an array of silicon-comprising emitter structures. A substrate having a plurality of silicon-comprising emitter structures thereover is provided. The emitter structures have base portions and ends above the base portions. A layer of spin-on-glass is formed over the substrate. The layer of spin-on-glass covers the base portions of the emitter structures and leaves the ends exposed. While the layer of spin-on-glass covers the base portions, the ends are exposed to conditions which alter the ends relative to the base portions.

In yet another aspect, the invention encompasses a cathode assembly which includes a plurality of silicon-comprising emitter structures projecting over a substrate. The emitter structures have base portions and ends above the base portions, and the ends comprise a different material than the base portions.

BRIEF DESCRIPTION OF THE DRAWINGS

Preferred embodiments of the invention are described below with reference to the following accompanying drawings.

FIG. 7 is a fragmentary, diagrammatic, cross-sectional view of a field emission display incorporating the treated emitters of FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect, the invention encompasses methods of treating portions of substantially upright silicon-comprising structures (such as, for example, silicon-comprising emitter structures), while leaving other portions untreated. In particular embodiments, the methodology can be utilized for treating tip regions (i.e., apexes) of silicon-comprising emitter structures, while leaving base regions untreated. Such can advantageously enable modification of electron emitting portions of emitter structures, while not altering physical properties of underlying portions of the emitter structures. Specific embodiments are described with reference to FIGS. 1–6.

Figure 1:
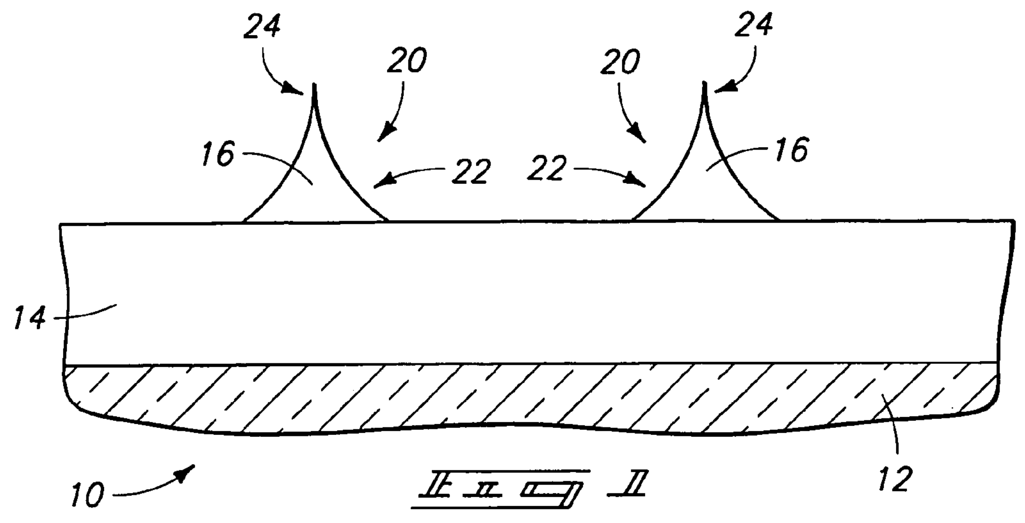
FIG. 1 is a diagrammatic, cross-sectional, fragmentary view of a portion of an emitter array assembly illustrated at a preliminary step of a method of the present invention.

Referring to FIG. 1, a fragment 10 of a semiconductive material construction is illustrated at a preliminary step of a method of the present invention. Fragment 10 comprises a glass plate 12, a first semiconductive material layer 14 overlying glass plate 12, and emitter structures 20 overlying first semiconductive material layer 14. Emitter structures 20 comprise a second semiconductive material 16. Semiconductive material 14 can comprise either p-type doped or n-type doped semiconductive material, (such as, for example, monocrystalline silicon), and semiconductive material 16 can comprise doped polycrystalline silicon (polysilicon) material, or, in specific embodiments, consist essentially of conductively doped polysilicon. Materials 12, 14 and 16 together comprise a conventional emitter tip array construction, and can be formed by conventional methods.

To aid in interpretation of this disclosure and the claims that follow, it is noted that layer 14 can be referred to as a "semiconductive substrate". More specifically, the term "semiconductive substrate" is defined to mean any construction comprising semiconductive material, including, but not limited to, bulk semiconductive materials (either alone or in assemblies comprising other materials thereon), and semiconductive material layers (either alone or in assemblies comprising other materials). The term "substrate" refers to any supporting structure, including, but not limited to, the semiconductive substrates described above.

Emitter structures 20 represent a portion of an array of emitter structures. Such array can be referred to as a "cathode array," as the emitters can be incorporated as cathodes in electron emission devices. Each of emitter structures 20 is a substantially upright silicon-comprising structure comprising a base portion 22 and an end portion 24 above the base portion (end portion 24 can also be referred to as an apex, or tip).

A next aspect of the shown exemplary embodiment comprises forming a masking layer over base portions 22 to protect base portions 22 from subsequent conditions. Exemplary methods for forming the masking layer are described with reference to FIGS. 2–4, with FIGS. 2 and 3 illustrating a first embodiment method, and FIG. 4 illustrating a second embodiment method.

Figure 2:
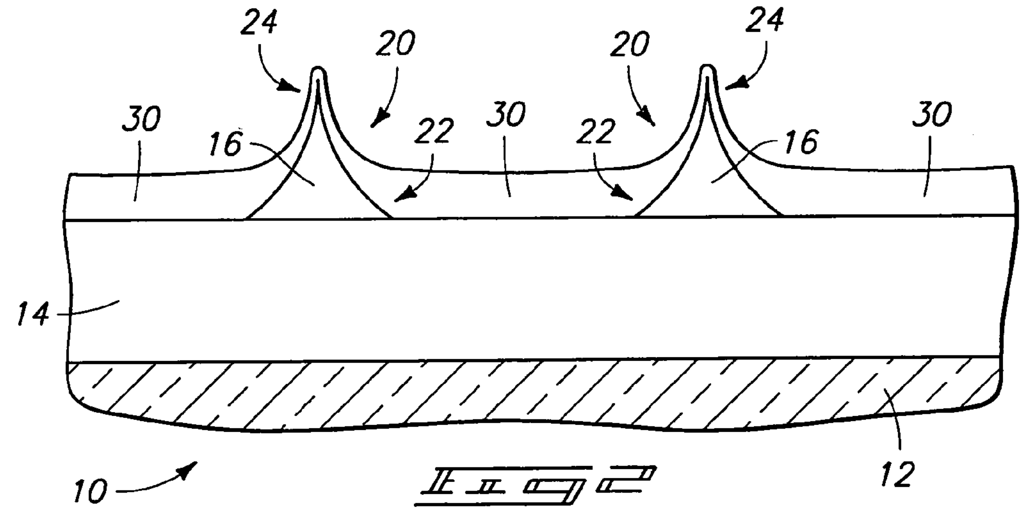
FIG. 2 is a view of the FIG. 1 assembly shown at a processing step subsequent to that of FIG. 1.

Referring to FIG. 2, a masking layer 30 is provided over semiconductive material 14 and over emitter structures 20. Masking material 30 is preferably provided to be thinner over apexes 24 than over base regions 22. Such can be accomplished, for example, by applying material 30 as a liquid. Exemplary processes include applying material 30 through spin-on-glass methodologies, or through so-called "Flowfill™" methodologies. In Flowfill™ methodologies, material 30 is initially provided as silanol (or an organic derivative of silanol). The silanol can be subsequently converted to silicon dioxide through conventional treatment methodologies.

Figure 3:
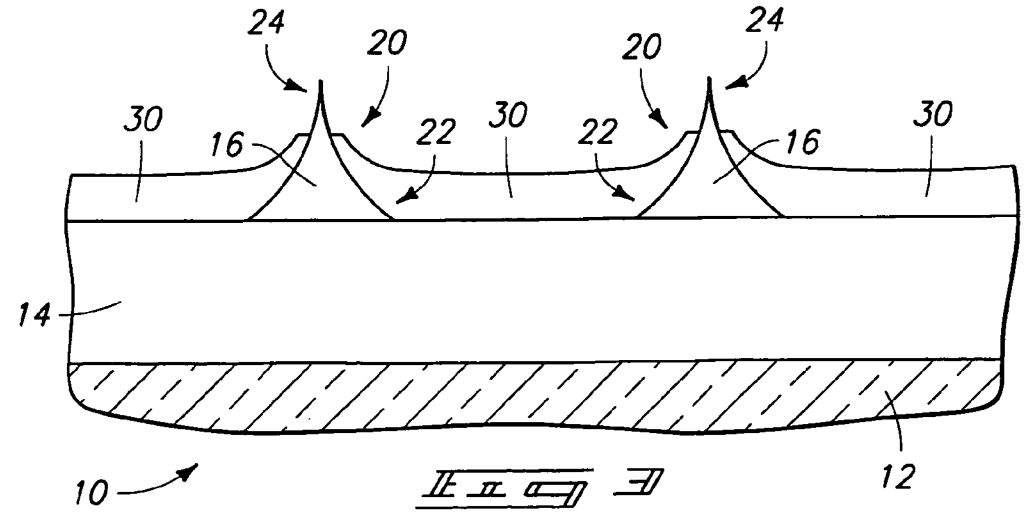
FIG. 3 is a view of the FIG. 1 assembly shown at a processing step subsequent to that of FIG. 2.

Referring to FIG. 3, material of layer 30 is removed from over apexes 24, but left over base regions 22. In embodiments in which layer 30 comprises either spin-on-glass or silicon dioxide, such can be accomplished by dipping apexes 24 in a hydrofluoric acid-comprising material. For instance, if material 30 comprises spin-on-glass having a thickness of less than 50 Å over apexes 24, the selective removal of material 30 from over apexes 24 can comprise a dip in a hydrofluoric acid solution for about five seconds.

Figure 4:
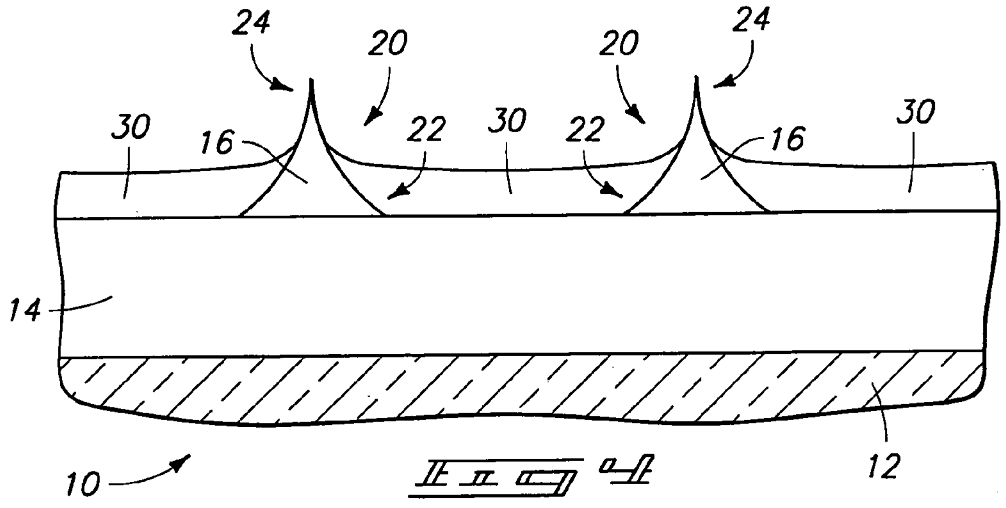
FIG. 4 is a view of the FIG. 1 assembly shown at a processing step subsequent to that of FIG. 1 in accordance with a second embodiment method of the present invention.

Referring to FIG. 4, another method of applying material 30 over emitters 20 is to utilize conditions which form material of layer 30 only over base regions 22, and not over apexes 24. Such conditions can include applying material of layer 30 as a liquid, and adjusting the viscosity of such liquid to effectively have the material run off the steep surfaces of apexes 24. The liquid material of layer 30 then collects over layer 14 to a level which covers base regions 22.

Regardless of whether the embodiment of FIGS. 2 and 3 is utilized, or the embodiment of FIG. 4 is utilized, the result is a construction having base regions 22 of emitters 20 protected by a masking layer 30, while apexes 24 are exposed through the masking layer 30.

Figure 5:
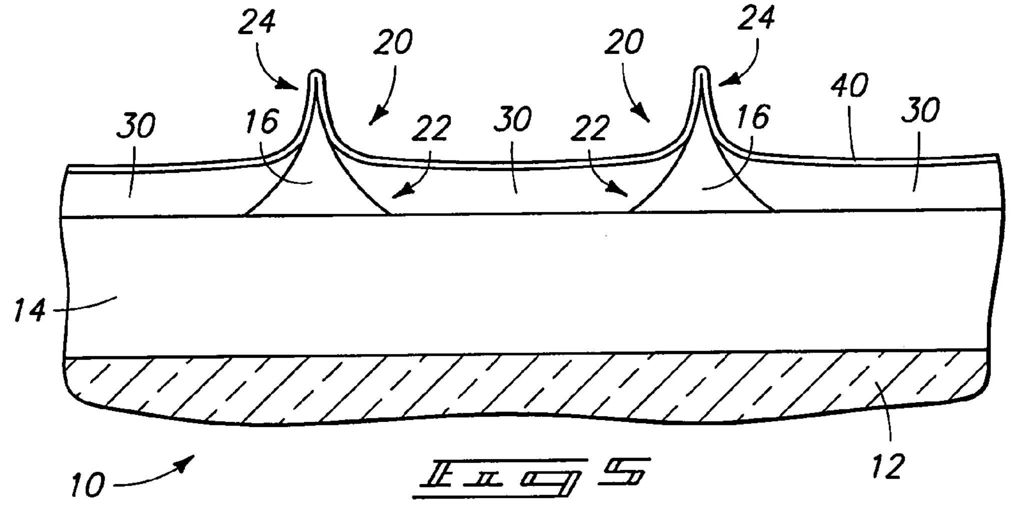
FIG. 5 is a view of the FIG. 4 assembly shown after a first embodiment treatment process.
Figure 6:
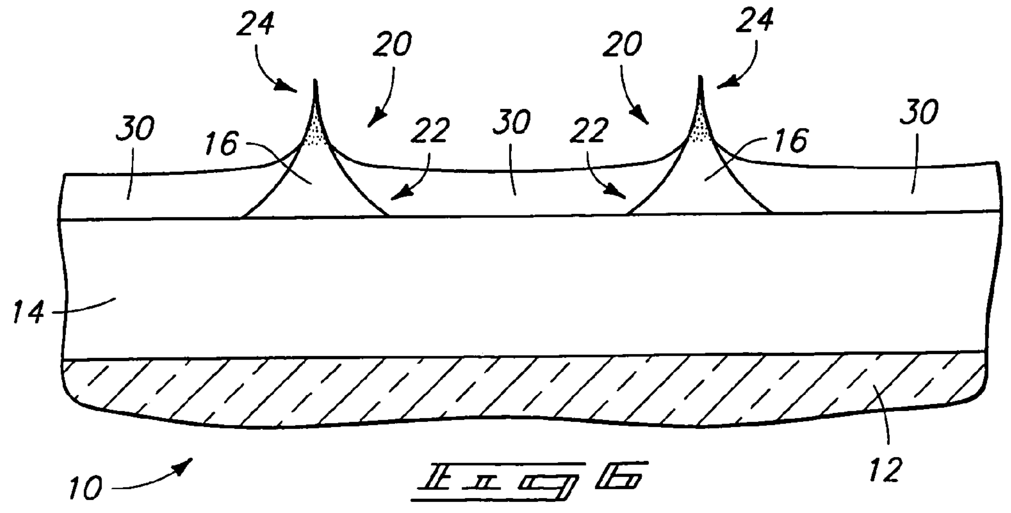
FIG. 6 is a view of the FIG. 4 assembly shown after a second embodiment treatment process.

FIGS. 5 and 6 illustrate methods of treating apexes 24 with conditions which alter apex regions 24 relative to base regions 22. FIG. 5 illustrates first embodiment processing conditions, and FIG. 6 illustrates second embodiment processing conditions.

Referring to FIG. 5, a low work function material 40 is provided over apex regions 24 and over masking layer 30. The term "low work function" is used herein to refer to materials having lower work functions than material 16. As discussed above, in particular applications material 16 comprises silicon. In such particular applications "low work function" can refer to materials having lower work functions than silicon. In applications in which material 16 comprises silicon, low work function material 40 can comprise, for example, diamond, cesium (such as, for example, cesiated carbon) or boronitride (such as, for example, sulfur doped boronitride). The provision of low work function material 40 over and against apexes 24 can alter electron emission properties of emitters 20. Specifically, low work function material 40 can increase electron emission across the array of emitters 20. By selectively forming low work function material 40 only against apexes 24, and not against base regions 22, the methodology of the present invention can avoid adversely affecting physical properties of base region 22 with the low work function material of layer 40. Potential adverse effects that could occur if low work function material 40 were provided against base region 22 include spurious electron emission from the base regions of emitters 20. Accordingly, the selective provision of low work function material 40 over only apexes 24 of emitters 20 can form improved emitter devices relative to devices having low work function material provided over an entire surface (i.e., both a base region and an apex region) of an emitter structure.

After formation of low work function material 40 over apexes 24, the construction 10 can be incorporated into, for example, a field emission display device. Masking material 30 and low work function material 40 can be removed from between emitters 20 prior to incorporation in the device. Such removal can be accomplished by, for example, photolithographic processing wherein a photoresist mask is utilized to protect apexes 24 while materials of layers 30 and 40 are etched from between the apexes. Suitable etching conditions can include, for example, HF based solutions or other etchants depending on the low work function material.

Referring to FIG. 6, an alternative method of treating apex regions 24 is illustrated. Specifically, apex regions 24 have been subjected to processing which forms porous silicon (represented by stippling in FIG. 6) within the apex regions. Such formation of porous silicon can increase electron emission and improve uniformity across an array of emitters 20, and can also improve a quality of electron emission from individual emitters 20 of the array. The formation of porous silicon at tip regions 24 can be accomplished by exposing fragment 10 to electrochemical etching in the presence of hydrofluoric acid. During such exposure, layer 30 protects base portions 22 so that apex regions 24 are rendered more porous than base portions 22 by the electrochemical etching. The electrochemical etching procedure can vary depending on whether silicon-comprising material 16 of emitter structures 20 is doped with an n-type material or a p-type material. Specifically, if silicon-comprising material 16 is doped with an n-type material, tip regions 24 are preferably exposed to light during the electrochemical etching. The light can be generated by, for example, a tungsten lamp. If, on the other hand, silicon-comprising material 16 is doped with a p-type material, the electrochemical etching preferably occurs in the dark.

After tip regions 24 have been rendered porous, masking layer 30 can be removed. Methods for removing masking layer 30 can include, for example, photolithographic processing wherein photoresist blocks are formed to protect apex regions 24. Subsequently, the material of layer 30 that is between apex regions 24 is exposed to etching conditions which remove such material from over silicon-comprising layer 14. The etching conditions can include, for example, HF based solutions or other etchants depending on the masking material.

FIG. 7 illustrates the porous tipped emitter devices 20 of FIG. 6 incorporated into a field emission display device 70. Field emission display device 70 includes dielectric regions 72, spacers 73, an extractor 74, and a luminescent screen 76. Screen 76 is associated with a face plate 80, and emitters 20 are part of a base plate structure 82. Device 70 is constructed with face plate 80 spaced from base plate 82. Techniques for forming field emission displays are described in U.S. Pat. Nos. 5,151,061; 5,186,670 and 5,210,472; hereby expressly incorporated by reference herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A cathode assembly comprising:

a substrate having a plurality of substantially conical emitter tips thereover, each of the conical emitter tips terminating in a pointed apex and having a tip portion sidewall and a frustum portion sidewall; and material over the substrate and between at least two of the emitter tips, the material having an upper surface and edges contacting the frustum portion sidewall without contacting the tip portion sidewall, wherein the entirety of the upper surface is exposed.

2. The assembly of claim 1 wherein the material comprises silicon dioxide.

3. The assembly of claim 1 wherein the emitter tips comprise silicon.

4. The assembly of claim 3 wherein the emitter tips comprise conductively doped polysilicon.

5. The assembly of claim 3 wherein the emitter tips consist essentially of conductively doped polysilicon.

6. The assembly of claim 3 wherein the emitter tips comprise conductively doped silicon.

7. The assembly of claim 3 wherein the emitter tips consist essentially of conductively doped silicon.

* * * * *